(12) United States Patent
Morita et al.

(10) Patent No.: US 9,112,503 B2
(45) Date of Patent: Aug. 18, 2015

(54) ELECTROMAGNETIC COIL DRIVE DEVICE

(75) Inventors: Akira Morita, Tokyo (JP); Takahiro Taguchi, Kounosu (JP)

(73) Assignees: FUJI ELECTRIC CO., LTD., Kawasaka-shi (JP); FUJI ELECTRIC FA COMPONENTS & SYSTEMS CO., LTD., Tokyo (JP)

( * ) Notice: Subject to any disclaimer, the term of this patent is extended or adjusted under 35 U.S.C. 154(b) by 22 days.

(21) Appl. No.: 14/116,240

(22) PCT Filed: Aug. 2, 2012

(86) PCT No.: PCT/JP2012/004921
§ 371 (c)(1),
(2), (4) Date: Nov. 15, 2013

(87) PCT Pub. No.: WO2013/027342
PCT Pub. Date: Feb. 28, 2013

(65) Prior Publication Data
US 2014/0092515 A1 Apr. 3, 2014

(30) Foreign Application Priority Data
Aug. 19, 2011 (JP) .................................. 2011-179771

(51) Int. Cl.
H01H 47/32 (2006.01)
H03K 17/687 (2006.01)
H01F 7/06 (2006.01)

(52) U.S. Cl.
CPC ............ *H03K 17/6877* (2013.01); *H01F 7/064* (2013.01)

(58) Field of Classification Search
USPC ......................................................... 361/156
See application file for complete search history.

(56) References Cited

U.S. PATENT DOCUMENTS

| | | | | |
|---|---|---|---|---|
| 3,829,717 A | * | 8/1974 | Harrison | 327/540 |
| 4,040,397 A | * | 8/1977 | Leichle | 123/490 |
| 4,503,480 A | * | 3/1985 | Pickard et al. | 361/152 |
| 4,675,776 A | * | 6/1987 | Howell | 361/92 |
| 4,845,420 A | * | 7/1989 | Oshizawa et al. | 323/222 |
| 5,374,312 A | | 12/1994 | Hasebe et al. | |
| 5,910,890 A | * | 6/1999 | Hansen et al. | 363/41 |
| 6,317,248 B1 | * | 11/2001 | Agrawal et al. | 359/265 |
| 7,740,225 B1 | | 6/2010 | Estelle | |
| 8,864,373 B2 | * | 10/2014 | Vu et al. | 374/152 |

FOREIGN PATENT DOCUMENTS

| | | |
|---|---|---|
| JP | S60-053285 A | 3/1985 |
| JP | S61-256608 A | 11/1986 |
| JP | S63-193176 U | 12/1988 |
| JP | 3365181 B | 1/2003 |
| JP | 2009-065246 A | 3/2009 |

* cited by examiner

*Primary Examiner* — Ronald W Leja
(74) *Attorney, Agent, or Firm* — Manabu Kanesaka

(57) ABSTRACT

An electromagnetic coil drive device has a semiconductor switch connected in series with an electromagnetic coil for controlling a current supplied to the coil; a capacitor; a comparator for comparing a voltage to charge and discharge the capacitor with two different voltages, for generating a signal to operate on-off of the semiconductor switch in accordance with a result of a comparison; a first charging circuit to charge the capacitor based on a voltage applied to the coil; and a discharging circuit to discharge the capacitor. The first charging circuit has a first resistor and at least one compensating circuit connected in parallel with the first resistor; and a resistor and a Zener diode are connected in series in the compensating circuit.

4 Claims, 5 Drawing Sheets

ELECTROMAGNETIC COIL DRIVE DEVICE

RELATED APPLICATIONS

The present application is National Phase of International Application No. PCT/JP2012/004921 filed Aug. 2, 2012, and claims priority from Japanese Applications No. 2011-179771 filed Aug. 19, 2011.

TECHNICAL FIELD

The present invention relates to an electromagnetic coil drive device which applies a current to an electromagnetic coil so as to drive the coil.

BACKGROUND ART

Conventionally, a drive device described in Patent literature 1 has been known as this type of drive device in the background art.

This conventional drive device has a semiconductor switch which is connected in series with an electromagnetic coil so as to control a current supplied to the coil, a capacitor, a comparator with a hysteresis function, which compares a voltage applied to the capacitor with two voltages so as to generate a signal for operating on-off of the semiconductor switch in accordance with a result of the comparison, and a charging and discharging circuit to charge and discharge the capacitor.

In the drive device configured thus, the semiconductor switch is operated to be turned on-off in accordance with the signal outputted from the comparator. In this manner, a predetermined current is supplied to the electromagnetic coil so that the coil is excited.

Since the excitation force of the electromagnetic coil is determined based on the current supplied to the electromagnetic coil, it is desirable that the current applied to the coil is measured and set at a constant value. Therefore, conventionally, the current flowing into the coil is measured by a Hall Effect element, a current sensing resistor, etc., and control is made so that the measured current becomes constant.

CITATION LIST

Patent Literature

Patent Literature 1: Japanese Patent No. 3365181

SUMMARY OF INVENTION

Technical Problem

When the Hall Effect element is used, however, there is a problem that external magnetic field interference and production cost increase. When the sensing resistor is used, there is an electric power loss in the sensing resistor undesirably.

Under such a situation, it is requested to solve these problems. At the same time, when a voltage applied to an electromagnetic coil increases so that the current of the coil increases or when the environmental temperature changes so that the current of the coil decreases, it is requested that these current changes can be coped with to stabilize the current of the coil.

Therefore, the invention has been accomplished with the issue focused on the aforementioned points. An object of the invention is to provide an electromagnetic coil drive device which is configured to suppress the change of a current of an electromagnetic coil caused by the increase of a voltage applied to the electromagnetic coil etc. as much as possible so as to stabilize the current of the coil.

Solution to Problem in order to achieve the foregoing object, the invention has the following configurations.

An electromagnetic coil drive device according to an aspect of the invention includes a semiconductor switch connected in series with an electromagnetic coil for controlling a current supplied to the coil; a capacitor; a comparator for comparing a voltage for charging and discharging the capacitor with two different voltages, for generating a signal to operate on-off of the semiconductor switch in accordance with a result of a comparison; a first charging circuit to charge the capacitor based on a voltage applied to the coil; and a discharging circuit to discharge the capacitor. The first charging circuit has a first resistor and at least one compensating circuit which is connected in parallel with the first resistor; and a resistor and a Zener diode are 4connected in series in the compensating circuit.

In addition, the electromagnetic coil drive device may further include a second charging circuit to charge the capacitor based on a stabilized voltage.

In addition, the compensating circuit may have a first compensating circuit in which a second resistor and a first Zener diode are connected in series; and a second compensating circuit in which a third resistor and a second Zener diode are connected in series. The first Zener diode and the second Zener diode may have different Zener voltages.

In addition, the first charging circuit may further have a temperature sensing resistor element connected in series with the first resistor.

In addition, the temperature sensing resistor element may have a positive temperature coefficient.

In addition, an electromagnetic coil drive device according to another aspect of the invention includes a semiconductor switch connected in series with an electromagnetic coil for controlling a current supplied to the coil; a capacitor; a comparator for comparing a voltage to charge and discharge the capacitor with two different voltages, for generating a signal to operate on-off of the semiconductor switch in accordance with a result of a comparison; a first charging circuit to charge the capacitor based on a voltage applied to the coil; and a discharging circuit to discharge the capacitor. The first charging circuit has a first resistor and a temperature sensing resistor element; and the first resistor and the temperature sensing resistor element are connected in series or in parallel.

In addition, the electromagnetic coil drive device may further include a second charging circuit to charge the capacitor based on a stabilized voltage.

In addition, the temperature sensing resistor element may have a positive temperature coefficient.

Advantageous Effects of Invention

According to the invention configured thus, the change of a current of an electromagnetic coil caused by the increase of a voltage applied to the coil, etc. can be suppressed as much as possible so that the current of the coil can be stabilized.

DESCRIPTION OF EMBODIMENTS

Embodiments of the invention will be described below with reference to the drawings.

(Configuration of First Embodiment)

Figure 1:
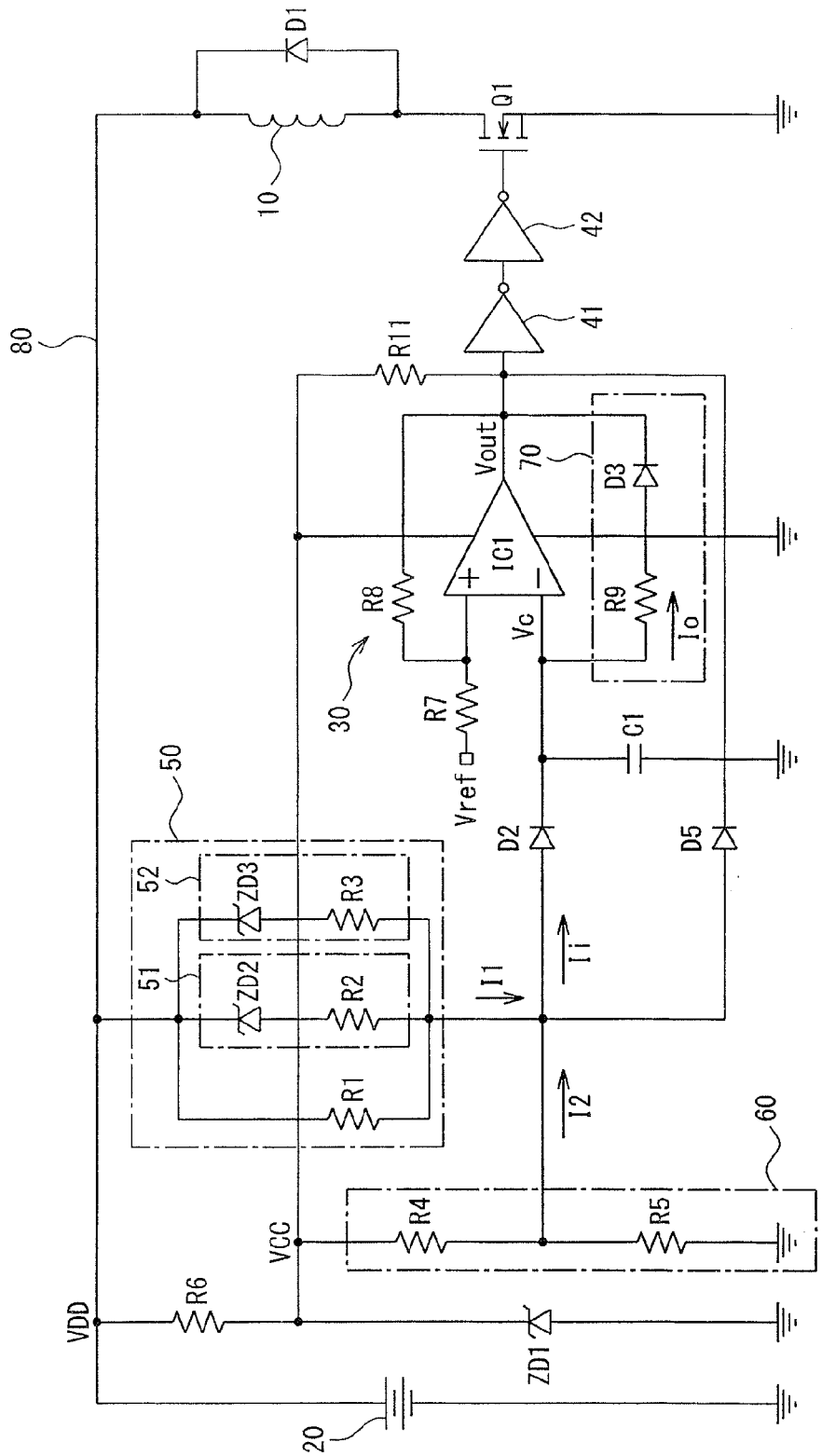
FIG. 1 is a circuit diagram of a first embodiment of an electromagnetic coil drive device according to the invention.

FIG. 1 is a circuit diagram of a first embodiment of an electromagnetic coil drive device according to the invention.

The first embodiment is configured so that a current is supplied to an electromagnetic coil 10 from a power supply 20 and a constant current flows into the coil 10 even when a power supply voltage VDD of the power supply 20 changes.

To this end, the first embodiment provides a field effect transistor Q1 which is a semiconductor switch, a comparator 30 with a hysteresis function, inverters 41 and 42, a capacitor C1, two charging circuits 50 and 60 which charge the capacitor C1, and a discharging circuit 70 which discharges electric charges of the capacitor C1, as shown in FIG. 1.

In addition, as shown in FIG. 1, the first embodiment is configured such that a resistor R6 and a Zener diode ZD1 are connected in series between a power supply line 80 and the ground so that a stabilized internal voltage VCC can be obtained from a common connection portion between the resistor R6 and the Zener diode ZD1.

One end of the electromagnetic coil 10 is connected to the power supply line 80 so that the power supply voltage VDD is directly applied to the electromagnetic coil 10. This is to improve the efficiency of the power supply. In addition, the other end of the electromagnetic coil 10 is connected to the drain of the field effect transistor Q1. A flywheel diode D1 is connected to the opposite ends of the coil 10 in parallel therewith. The diode D1 has a function of applying the current to the coil 10 using a voltage generated by a counter electromotive force generated at the coil 10 when the field effect transistor Q1 is turned off.

The field effect transistor Q1 is connected in series with the coil 10 so as to control the current supplied to the coil 10 from the power supply 20. To this end, the drain of the field effect transistor Q1 is connected to the coil 10 while the source of the field effect transistor Q1 is grounded. In addition, the gate of the field effect transistor Q1 is connected to an output terminal of the inverter 42.

The comparator 30 compares a charge/discharge voltage (voltage between both ends) Vc of the capacitor C1 with two voltages VH and VL (see FIG. 2), to thereby output a signal corresponding to the comparison result as a signal for operating the field effect transistor Q1 to turn on/off the field effect transistor Q1. To this end, the comparator 30 has an operational amplifier (op-amp) IC1, and a resistor R7 and a resistor R8 for providing hysteresis, as shown in FIG. 1. In addition, the operational amplifier IC1 is of an open collector type. As shown in FIG. 1, a resistor R11 is connected to an output stage of the operational amplifier IC1 so that a voltage can be outputted.

An inverting input terminal (−) of the operational amplifier IC1 is connected to one end of the capacitor C1 while the other end of the capacitor C1 is grounded. A reference voltage Vref is applied to a non-inverting input terminal (+) of the operational amplifier IC1 through the resistor R7. The resistor R8 is connected between the non-inverting input terminal (+) and the output terminal of the operational amplifier IC1. The internal voltage VCC is supplied to one power supply terminal of the operational amplifier IC1 while the other power supply terminal of the operational amplifier IC1 is grounded.

Figure 2:
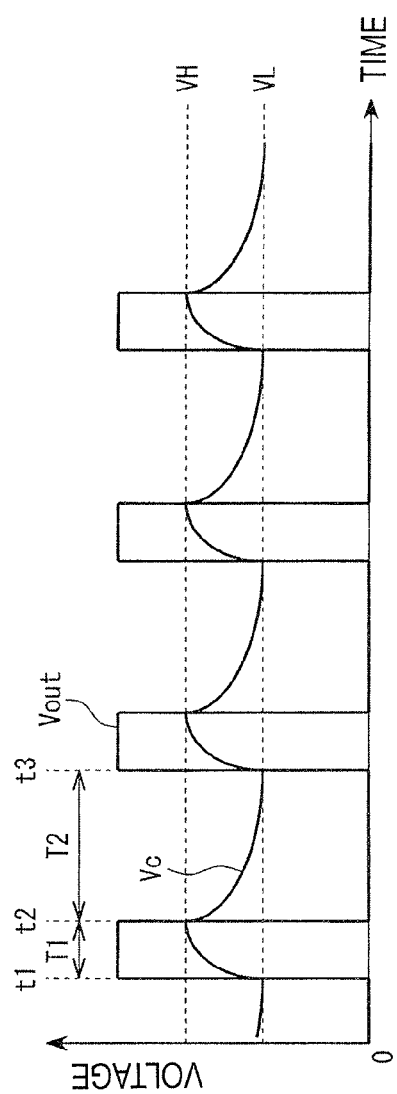
FIG. 2 is a graph showing a waveform example of operation of the first embodiment.

According to the comparator 30 configured, thus, when the reference voltage Vref applied to one end of the resistor R7 is used, an upper limit threshold voltage VH and a lower limit threshold voltage VL used for making comparison with the voltage Vc between both ends of the capacitor C1 can be obtained (see FIG. 2).

The inverter 41 logically inverts the output of the comparator 30 so as to supply this logically inverted binary signal to the inverter 42. The inverter 42 logically inverts the output of the inverter 41 so as to supply this logically inverted binary signal to the gate of the field effect transistor Q1.

As shown in FIG. 1, the charging circuit 50 is a circuit for charging the capacitor C1 based on the voltage applied to the coil 10. One end side of the charging circuit 50 is connected to the power supply line 80 while the other end side of the charging circuit 50 is connected to one end of the capacitor C1 through a diode D2. The charging circuit 50 has a feedback resistor R1, and a first compensating circuit 51 and a second compensating circuit 52 which are connected in parallel with the feedback resistor R1.

One end of the feedback resistor R1 is connected to the power supply line 80 while the other end of the feedback resistor R1 is connected to the one end of the capacitor C1 through the diode D2. In the first compensating circuit 51, a resistor R2 and a Zener diode ZD2 are connected in series, and this series circuit is connected in parallel with the feedback resistor R1. In the second compensating circuit 52, a resistor R3 and a Zener diode ZD3 are connected in series, and this series circuit is connected in parallel with the feedback resistor R1.

As shown in FIG. 1, the charging circuit 60 is a circuit for charging the capacitor C1 based on the stabilized internal voltage VCC generated at the opposite ends of the Zener diode ZD1. To this end, the charging circuit 60 has a voltage divider circuit which is constituted by a resistor R4 and a resistor R5 and which divides the internal voltage VCC. A common connection portion between the resistor R4 and the resistor R5 is connected to the one end of the capacitor C1 through the diode D2. In addition, the common connection portion between the resistor R4 and the resistor R5 is connected to the output terminal of the operational amplifier IC1 through a diode D5.

As shown in FIG. 1, in the discharging circuit 70, a resistor R9 and a diode D3 are connected in series, one end of the resistor R9 is connected to the one end of the capacitor C1 and the cathode of the diode D3 is connected to the output terminal of the operational amplifier IC1.

(Operation of First Embodiment)

An example of operation of the first embodiment will be described below with reference to FIGS. 1 and 2.

When the voltage Vc of the capacitor C1 shown in FIG. 1 falls on or below the lower limit threshold voltage VL of the comparator 30 at time t1 in FIG. 2, the output voltage Vout of the comparator 30 changes from a low level to a high level.

In response to this change, the capacitor C1 starts to be charged by the charging circuit 50 and the charging circuit 60. During the charging, a charge current Ii for charging the capacitor C1 comprises two components, i.e. a current I1 and a current I2 as shown in FIG. 1. These two currents I1 and I2 charge the capacitor C1 through the diode D2. The current I1 is supplied through the charging circuit 50 from the power supply voltage VDD which is the voltage applied to the coil 10. On the other hand, the current I2 is supplied based on a voltage obtained by dividing the stabilized internal voltage VCC by the resistors R4 and R5 of the charging circuit 60.

Then, charging of the capacitor C1 goes on. When the voltage Vc of the capacitor C1 reaches at least the upper limit threshold voltage VH of the comparator 30 at time t2 in FIG. 2, the output voltage Vout of the comparator 30 changes from the high level to the low level.

In response to this change, the stored electric charges of the capacitor C1 start to be released by the discharging circuit 70. A discharge current Io from the capacitor C1 passes through the resistor R9 and the diode D3 and flows into the output terminal of the operational amplifier IC1.

Then, discharging of the capacitor C1 goes on. When the voltage Vc of the capacitor C1 falls on or below the lower limit threshold voltage VL of the comparator 30 at time t3 in FIG. 2, the output voltage Vout of the comparator 30 changes from the low level to the high level. In response to this change, the capacitor C1 starts to be charged by the charging circuit 50 and the charging circuit 60.

By a series of such operations, the capacitor C1 repeats charging and discharging so that pulses corresponding thereto are output as the output voltage Vout from the comparator 30. The output voltage Vout of the comparator 30 is logically inverted by the inverters 41 and 42 so that the field effect transistor Q1 is controlled on/off by the pulses outputted from the inverter 42.

Operations of the charging circuits 50 and 60 and the discharging circuit 70 in the case where the power supply voltage VDD increases in the first embodiment will be described below in detail with reference to FIG. 1.

As described above, in the first embodiment, the charge current I1 of the capacitor C1 comprises two components, i.e. the current I1 and the current I2. When the power supply voltage VDD increases under such an operation, the current I2 does not increase but stays constant. The reason is because the current I2 is based on the voltage obtained by dividing the internal voltage VCC in which the power supply voltage VDD is stabilized, by the resistors R4 and R5 of the charging circuit 60.

On the other hand, when the power supply voltage VDD increases, that is, when the voltage applied to the coil 10 increases, the current I1 tries to increase in response to this increase. However, the current I1 is supplied through the charging circuit 50 from the power supply voltage VDD. As shown in FIG. 1, the charging circuit 50 has the feedback resistor R1, and the first compensating circuit 51 and the second compensating circuit 52 which are connected in parallel with the feedback resistor R1.

Therefore, when the power supply voltage VDD increases, the resistor R2 of the first compensating circuit 51 and the resistor R3 of the second compensating circuit 52 are connected in parallel with the feedback resistor R1 to contribute to the charging with the charge current Ii in response to the increase. This point will be described below as follows.

In the first embodiment, the internal voltage VCC is stabilized. Therefore, the increase of the voltage difference (VDD−VCC) between the power supply voltage VDD and the internal voltage VCC reflects the increase of the power supply voltage VDD. It assumes that the relation of VZD2<VZD3 is established between the Zener voltage VZD2 of the Zener diode ZD2 of the first compensating circuit 51 and the Zener voltage VZD3 of the Zener diode ZD3 of the second compensating circuit 52.

Accordingly, the magnitude relation between the voltage difference (VDD−VCC) between the power supply voltage VDD and the internal voltage VCC and the Zener voltages VZD2 and VZD3 are classified into the cases of the following three expressions (1) to (3).

$$(VDD-VCC)<VZD2 \tag{1}$$

$$VZD2<(VDD-VCC)<VZD3 \tag{2}$$

$$VZD3<(VDD-VCC) \tag{3}$$

The expression (1) corresponds to the case where the voltage difference (VDD−VCC) caused by the increase of the power supply voltage VDD is lower than the Zener voltage VZD2 of the Zener diode ZD2 so that the current does not flow into the Zener diode ZD2. On this occasion, the current does not flow into the Zener diode ZD3 either. Accordingly, the resistor contributing to charging of the charging circuit 50 is only the resistor R1.

The expression (2) corresponds to the case where the voltage difference (VDD−VCC) caused by the increase of the power supply voltage VDD is higher than the Zener voltage VZD2 of the Zener diode ZD2 but lower than the Zener voltage VZD3 of the Zener diode ZD3. In this case, the current does not flow into the Zener diode ZD3 but flows into the Zener diode ZD2. Therefore, the resistors contributing to charging of the charging circuit 50 are the resistors R1 and R2. These two resistors R1 and R2 are connected in parallel to form a parallel circuit.

The expression (3) corresponds to the case where the voltage difference (VDD−VCC) caused by the increase of the power supply voltage VDD is higher than the Zener voltage VZD3 of the Zener diode ZD3. In this case, the current flows into both the Zener diode ZD2 and the Zener diode ZD3. Therefore, the resistors contributing to charging of the charging circuit 50 are the resistors R1, R2 and R3. These three resistors R1, R2 and R3 are connected in parallel to form a parallel circuit.

By such an operation, a combined resistance value of the resistors contributing to charging of the charging circuit 50 is smaller as the increase of the power supply voltage VDD is larger in the first embodiment. Therefore, when the power supply voltage VDD increases, the charge current Ii into the capacitor C1 increases so that a charging period T1 of the capacitor C1 is shortened. On the other hand, the resistance value of the resistor R9 which is a discharging resistor does not change even when the power supply voltage VDD increases. Accordingly, a discharge current Io of the capacitor C1 is constant and a discharging period T2 of the capacitor C1 is constant.

Therefore, the high-level period in the output voltage Vout of the comparator 30 is shortened while the low-level period in the output voltage Vout of the comparator 30 is constant. The output voltage Vout of the comparator is logically inverted by the inverter 41 and then further logically inverted by the inverter 42 so as to be applied to the gate of the field effect transistor Q1.

As a result, when the power supply voltage VDD increases in the first embodiment, the ON operation period in the field effect transistor Q1 can be shortened to suppress the increase of the current flowing into the coil 10.

Specific effects of the first embodiment will be described below with reference to FIG. 3.

Figure 3:
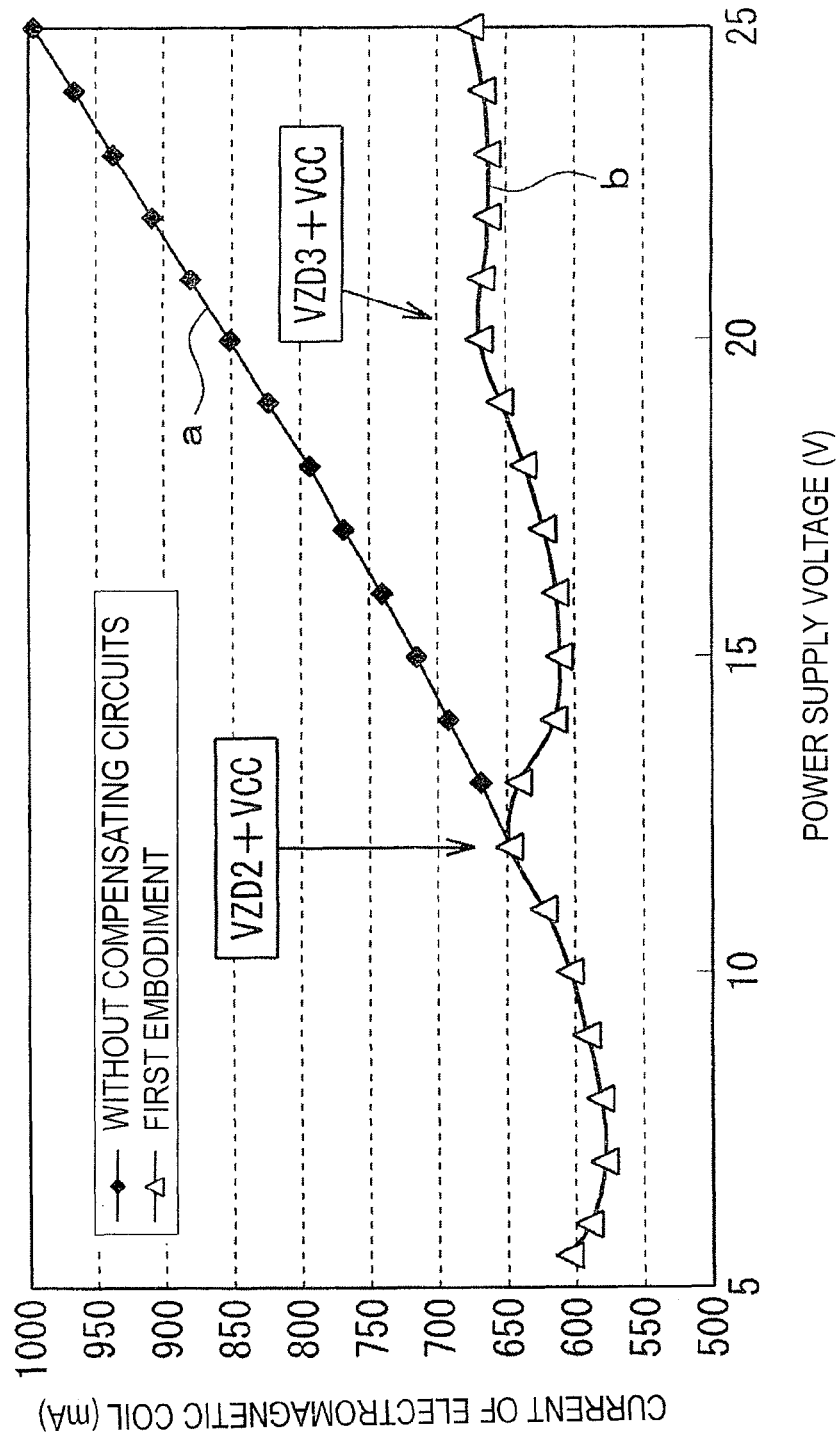
FIG. 3 is a graph showing the relation between a voltage applied to an electromagnetic coil and the current of the electromagnetic coil.

A curve a in FIG. 3 shows the relation between the power supply voltage VDD and the current flowing into the electromagnetic coil 10 when the compensating circuits 51 and of the charging circuit 50 are absent from the first embodiment. It can be found from the curve a that when the power supply voltage VDD increases, the current flowing into the electromagnetic coil 10 increases in response to the increase.

A curve b in FIG. 3 shows the relation between the power supply voltage VDD and the current flowing into the electromagnetic coil 10 according to the first embodiment. According to the curve b, even when the power supply voltage VDD increases, the current flowing into the electromagnetic coil 10 can be made substantially constant by the operations of the compensating circuits 51 and 52 of the charging circuit 50 so that the increase of the current can be suppressed in the first embodiment.

In addition, according to the curve b in FIG. 3, the power supply voltage is bent at the places (VZD2+VCC) and (VZD3+VCC) so that the current of the coil 10 is suppressed. This is because the resistors R2 and R3 of the compensating circuits 51 and 52 serve as charging resistors when the power supply voltage corresponds to those two voltages.

For example, when the power supply voltage VDD exceeds (VZD2+VCC), the charging resistance value of the charging circuit 50 decreases because the resistor R2 of the compensating circuit 51 is connected in parallel with the resistor R1. Therefore, the charge current flowing into the capacitor C1 increases so that the charging period T1 is shortened and the high-level period in the output voltage Vout of the comparator 30 is shortened. Thus, the ON time of the field effect transistor Q1 is shortened so that the increase of the current flowing into the coil 10 can be suppressed.

As described above, the first embodiment is designed so that the charging circuit 50 including the feedback resistor R1 and the first compensating circuit 51 and the second compensating circuit 52 connected in parallel with the feedback resistor R1 is provided as shown in FIG. 1. Therefore, according to the first embodiment, when the power supply voltage increases, the change of the current flowing into the electromagnetic coil 10 can be suppressed as much as possible so that the current of the coil can be stabilized.

(Second Embodiment)

Figure 4:
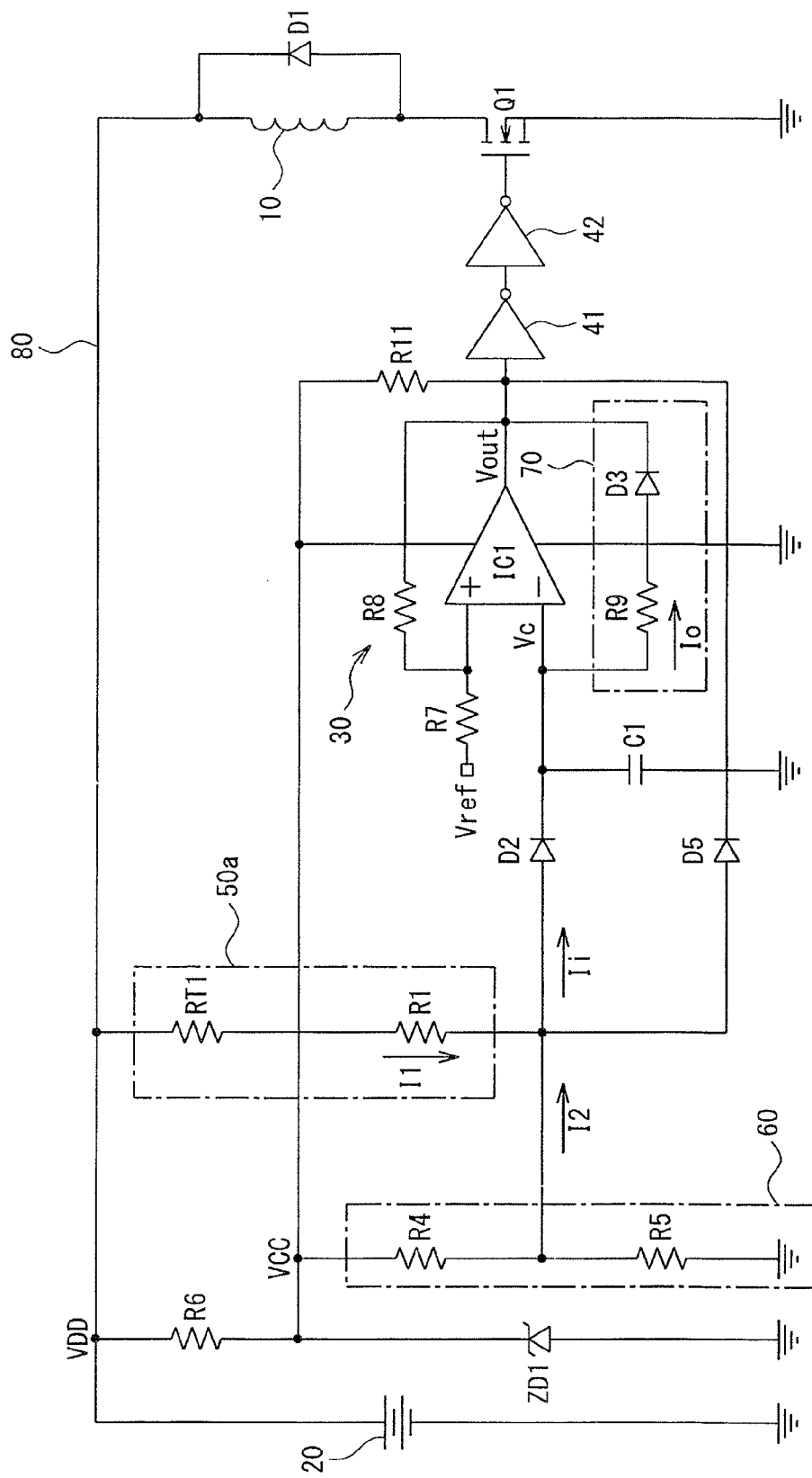
FIG. 4 is a circuit diagram of a second embodiment of the electromagnetic coil drive device according to the invention.

FIG. 4 is a circuit diagram of a second embodiment of the electromagnetic coil drive device according to the invention.

The second embodiment is designed so that a current is supplied to the electromagnetic coil 10 from the power supply 20, and the current is compensated so that a constant current can flow into the coil 10 when the resistance value of the coil 10 increases to change the current due to temperature rise in the coil 10.

To this end, the second embodiment provides a field effect transistor Q1 which is a semiconductor switch, a comparator 30 with a hysteresis function, inverters 41 and 42, a capacitor C1, two charging circuits 50a and 60 which charge the capacitor C1 and a discharging circuit 70 which discharges electric charges of the capacitor C1, as shown in FIG. 4.

In other words, the second embodiment is fundamentally the same as the configuration of the first embodiment shown in FIG. 1, except that the charging circuit 50 shown in FIG. 1 is replaced by the charging circuit 50a shown in FIG. 4. Accordingly, in the following configuration description, the same constituents will be referred to by the same references correspondingly, and detailed description thereof will he omitted as much as possible.

As shown in FIG. 4, the charging circuit 50a comprises a feedback resistor. R1 and a temperature sensing resistor element RT1 which are connected in series. One end of this series circuit is connected to one end of the electromagnet coil 10 while the other end of the series circuit is connected to one end of the capacitor C1 through the diode D2. In this example, one end of the temperature sensing resistor element RT1 is connected to the one end of the coil 10 while one end of the feedback resistor R1 is connected to the one end of the capacitor C1 through the diode D2.

The temperature sensing resistor element RT1 is an element whose resistance value changes in accordance with the change of the temperature. Here, the temperature sensing resistor element RT1 has a positive temperature coefficient. A thermistor or the like having a positive coefficient can be used as the temperature sensing resistor element RT1.

The fundamental operation of the second embodiment configured thus is the same as the fundamental operation of the first embodiment, and description thereof will be omitted.

Next, the operation in the case where the resistance value of the electromagnetic coil 10 increases due to the environmental temperate rise will be described in the second embodiment with reference to FIG. 4.

In this case, the current flowing into the coil 10 decreases due to the increase of the resistance value of the coil 10. In addition, the environmental temperature rise increases the resistance value of the temperature sensing resistor element RT1 of the charging circuit 50a. This increase of the resistance value increases the charging resistance of the charging circuit 50a. Accordingly, the current I1 decreases to elongate the charging time of the capacitor C1 and elongate the high-level period in the output voltage Vout of the comparator 30. In this manner, the ON time of the field effect transistor Q1 is elongated to increase the current flowing into the coil 10 so that the current flowing into the coil 10 can be stabilized.

As described above, the second embodiment is designed so that the charging circuit 50a in which the feedback circuit R1 and the temperature sensing resistor element RT1 are connected in series is provided as shown FIG. 4. Therefore, according to the second embodiment, when the resistance value of the electromagnetic coil 10 increases due to the environmental temperature rise, the change of the current flowing into the electromagnetic coil 10 is suppressed as much as possible so that the coil current can be stabilized.

(Third Embodiment)

Figure 5:
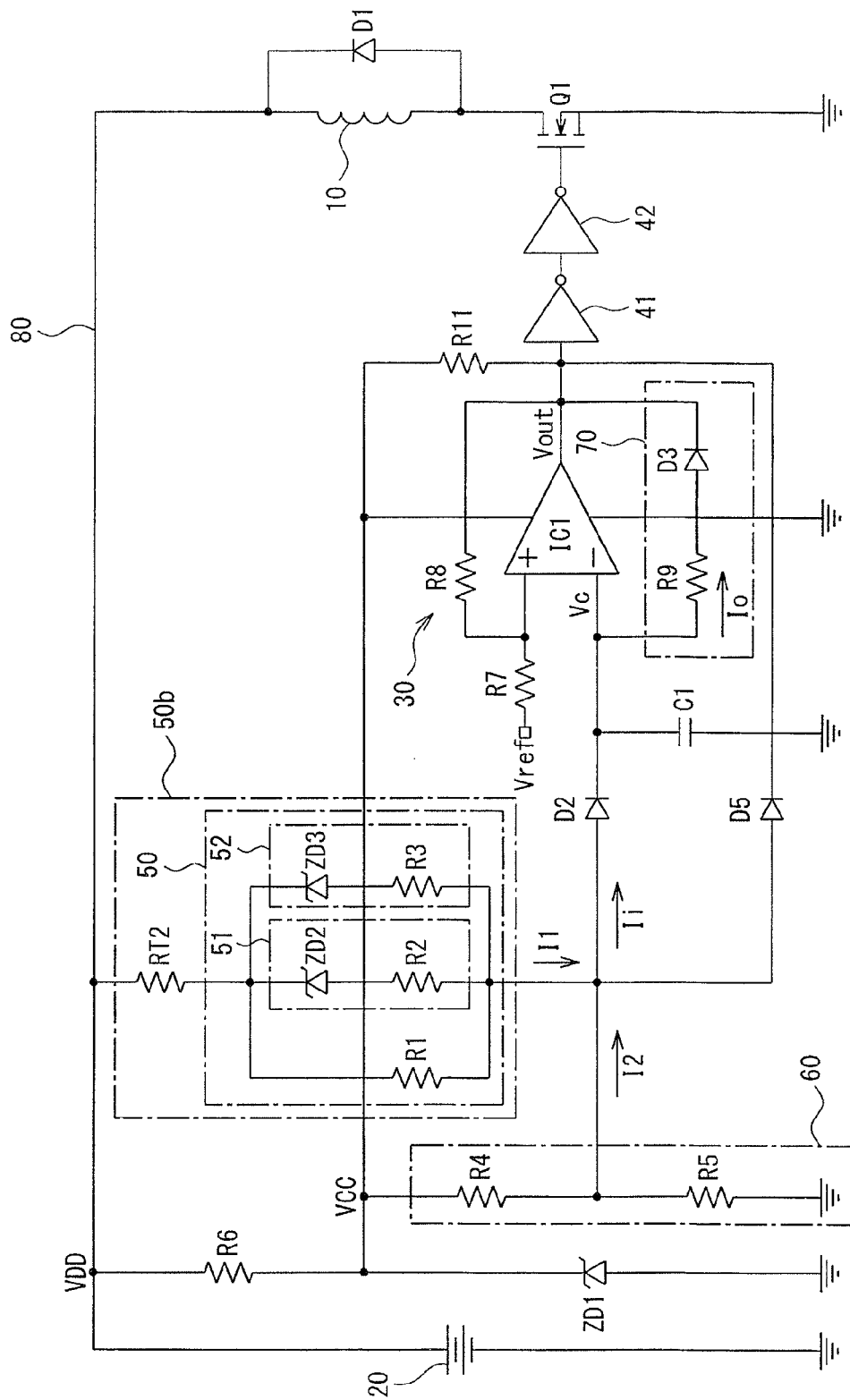
FIG. 5 is a circuit diagram of a third embodiment of the electromagnetic coil drive device according to the invention.

FIG. 5 is a circuit diagram of a third embodiment of the electromagnetic coil drive device according to the invention.

The third embodiment is designed so that when the voltage applied to the electromagnetic coil 10 increases or the environmental temperature rises so that there is a change (increase/decrease) in the current flowing into the coil 10 generated in response thereto, the change is suppressed so that a constant current can flow into the coil 10.

To this end, the third embodiment provides a field effect transistor Q1 which is a semiconductor switch, a comparator 30 with a hysteresis function, inverters 41 and 42, a capacitor C1, two charging circuits 50b and 60 which charge the capacitor C1, and a discharging circuit 70 which releases electric charges of the capacitor C1, as shown in FIG. 5.

In other words, the third embodiment is fundamentally the same as the configuration of the first embodiment, except that the charging circuit 50 shown in FIG. 1 is replaced by the charging circuit 50b shown in FIG. 5. Accordingly, in the following configuration description, the same constituents will be referred to by the same references correspondingly, and detailed description thereof will be omitted as much as possible.

As shown in FIG. 5, the charging circuit 50b is obtained by adding, a temperature sensing resistor element RT2 to the charging circuit 50 shown in FIG. 1. The temperature sensing resistor element RT2 has a positive temperature coefficient. A thermistor or the like having a positive coefficient can be used as the temperature sensing resistor element RT2.

In the charging circuit 50b, the charging circuit 50 and the temperature sensing resistor element RT2 are connected in series. One end side of this series circuit is connected to one end of the coil 10 while the other end side of the series circuit is connected to one end of the capacitor C1 through the diode D2.

Next, the operation of the third embodiment will be described with reference to FIG. 5.

According to the third embodiment, when the current of the coil 10 increases due to the increase of the power supply voltage VDD, the ON operation time in the field effect transistor Q1 is shortened to decrease the current flowing into the coil 10 by the same operation as that in the first embodiment.

On the other hand, when the resistance value of the coil 10 increases due to the rise of the environmental temperature, the current flowing into the coil 10 decreases. In addition, the environmental temperature rise increases the resistance value of the temperature sensing resistor element RT2 of the charging circuit 50b. This increase of the resistance value increases the charging resistance of the charging circuit 50b. Accordingly, the current I1 decreases to elongate the charging time of the capacitor C1 and elongate the high-level period in the output voltage Vout of the comparator 30. In this manner, the ON time of the field effect transistor Q1 is elongated to increase the current flowing into the coil 10.

Therefore, according to the third embodiment, when the voltage applied to the electromagnetic coil 10 increases or the environmental temperature rises so that the current of the coil 10 increases or decreases in response thereto, this increase or decrease can be suppressed to make a constant current flow into the coil 10.

(Modifications etc. of Embodiments)
(1) Although each of the aforementioned embodiments is designed so that the inverters 41 and 42 are provided between the comparator 30 and the field effect transistor Q1 (for example, see FIG. 1), these inverters 41 and 42 are not necessarily required and may be omitted.
(2) Although each of the aforementioned embodiments is designed so that the charging circuit 60 is provided (for example, see FIG. 1), the charging circuit 60 is not necessarily required and may be omitted.
(3) Although the aforementioned second embodiment is designed so that the temperature sensing resistor element RT1 of the charging circuit 50a is connected in series with the feedback resistor R1 as shown in FIG. 4, the temperature sensing resistor element RT1 may be connected in parallel with the feedback resistor R1 instead.

REFERENCE SIGNS LIST

10 . . . electromagnetic coil, 20 . . . power supply, 30 . . . comparator, 41, 42 . . . inverter, 50, 50a, 50b, 60 . . . charging circuit, 51 . . . first compensating circuit, 52 . . . second compensating circuit, 70 . . . discharging circuit, 80 . . . power supply line, Q1 . . . field effect transistor, C1 . . . capacitor, R1 . . . feedback resistor, R2, R3 . . . resistor, ZD2, ZD3 . . . Zener diode, RT1, RT2 . . . temperature sensing resistor element

What is claimed is:

1. An electromagnetic coil drive device, comprising:
   a semiconductor switch connected in series with an electromagnetic coil for controlling a current supplied to the coil;
   a capacitor;
   a comparator for comparing a voltage to charge and discharge the capacitor with two different voltages, for generating a signal to operate on-off of the semiconductor switch in accordance with a result of a comparison;
   a first charging circuit to charge the capacitor based on a voltage applied to the coil; and
   a discharging circuit to discharge the capacitor;
   wherein the first charging circuit has a first resistor and at least one compensating circuit connected in parallel with the first resistor, and
   the compensating circuit includes:
   a first compensating circuit in which a second resistor and a first Zener diode are connected in series, and
   a second compensating circuit in which a third resistor and a second Zener diode are connected in series; and
   the first Zener diode and the second Zener diode have different Zener voltages.

2. An electromagnetic coil drive device according to claim 1, further comprising a second charging circuit to charge the capacitor based on a stabilized voltage.

3. An electromagnetic coil drive device according to claim 1, wherein the first charging circuit further comprises a temperature sensing resistor element connected in series with the first resistor.

4. An electromagnetic coil drive device according to claim 3, wherein the temperature sensing resistor element has a positive temperature coefficient.

* * * * *

UNITED STATES PATENT AND TRADEMARK OFFICE
CERTIFICATE OF CORRECTION

PATENT NO.         : 9,112,503 B2                                   Page 1 of 1
APPLICATION NO.    : 14/116240
DATED              : August 18, 2015
INVENTOR(S)        : Akira Morita et al.

It is certified that error appears in the above-identified patent and that said Letters Patent is hereby corrected as shown below:

Title Page

Item (73) please change the address of one Assignee, FUJI ELECTRIC CO., LTD., from "Kawasaka-shi (JP)" to --Kawasaki-shi (JP)--.

Specification

Please change column 2, line 20, from "... are 4connected ..." to --... are connected ...--.

Please change column 5, line 33, from "current I1 of ..." to --current Ii of ...--.

Please change column 6, line 65, from "... circuits 51 and of" to --... circuits 51 and 52 of--.

Please change column 7, line 59, from "... thereof will he" to --... thereof will be--.

Signed and Sealed this
Ninth Day of February, 2016

Michelle K. Lee
*Director of the United States Patent and Trademark Office*